United States Patent
Kim

(10) Patent No.: US 7,569,479 B2
(45) Date of Patent: Aug. 4, 2009

(54) METHOD FOR FABRICATING SEMICONDUCTOR DEVICE

(75) Inventor: Jae Hong Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 136 days.

(21) Appl. No.: 11/636,307

(22) Filed: Dec. 8, 2006

(65) Prior Publication Data

US 2007/0134912 A1   Jun. 14, 2007

(30) Foreign Application Priority Data

Dec. 9, 2005   (KR)   ............... 10-2005-0120587

(51) Int. Cl.
*H01L 21/4763*   (2006.01)
(52) U.S. Cl. .............. 438/625; 438/629; 438/638; 438/687
(58) Field of Classification Search ........ 438/629, 438/637, 638, 653, 666, 667, 668, 672, 687
See application file for complete search history.

(56) References Cited

U.S. PATENT DOCUMENTS

| | | |
|---|---|---|
| 6,197,688 B1 | 3/2001 | Simpson |
| 6,297,154 B1 | 10/2001 | Gross et al. |
| 6,316,359 B1 | 11/2001 | Simpson |
| 6,380,083 B1 | 4/2002 | Gross |
| 6,727,176 B2* | 4/2004 | Ngo et al. .......... 438/660 |
| 2003/0216057 A1* | 11/2003 | Hussein et al. ...... 438/780 |
| 2005/0230263 A1* | 10/2005 | Dubin ............. 205/176 |
| 2007/0283886 A1* | 12/2007 | Chung et al. ........ 118/719 |

FOREIGN PATENT DOCUMENTS

| | | |
|---|---|---|
| CN | 1226080 A | 8/1999 |
| JP | 9-283557 A | 10/1997 |
| KR | 10-0635685 | 12/1999 |
| KR | 2000-0017528 | 3/2000 |

OTHER PUBLICATIONS

Michael Edith Gros and Christope Rink: Method for Constituting a Semiconductor Device Having a Copper Connection Portion: Mar. 25, 2000: Korean Patent Abstracts; Korean Intellectual Property Office, Republic of Korea.

The Semiconductor Device and Manufacturing Method [Semiconductor Equipment and Fabrication Method Thereof]; Korean Patent Registration No. 10-0635685: Published on Dec. 27, 1999: Korean Patent Abstracts; Korean Intellectual Property Office, Republic of Korea.

(Continued)

*Primary Examiner*—Kevin M Picardat
(74) *Attorney, Agent, or Firm*—The Law Offices of Andrew D. Fortney; Andrew D. Fortney; William E. Brow

(57) ABSTRACT

A method for fabricating a semiconductor device capable of preventing a device failure is provided. The method includes: forming an insulating layer with a contact hole on a semiconductor substrate; forming a seed layer on the contact hole through electroless plating process; and forming a metal interconnection in the contact hole on the seed layer.

15 Claims, 3 Drawing Sheets

OTHER PUBLICATIONS

Office Action, Korean Patent Application No. 10-2005-0120587; 2 Pgs.; Dated Nov. 15, 2006: Korean Intellectual Property Office, Republic of Korea.

Cindy Reidsema Simpson; "Interconnect Structure in Semiconductor Device and Method of Formation"; esp@cenet; Abstract of US 6,197,688, corresponding to Chinese Patent No. CN1226080; Aug. 18, 1999; esp@cenet Database—Worldwide.

Hidenori Hayashida and Shigeaki Ueda; "Method of Electrical Connection of Electric Element Chip to Interconnection Circuit"; Patent Abstracts of Japan; Publication No. 09-283557; Publication Date: Oct. 31, 1997; Japan Patent Office, Japan.

Chinese Office Action issued May 23, 2008 and English Translation; Chinese Patent Application No. 200610164285.8; The State Intellectual Property Office of P.R.C., People's Republic of China.

* cited by examiner

FIG. 1 (RELATD ART)
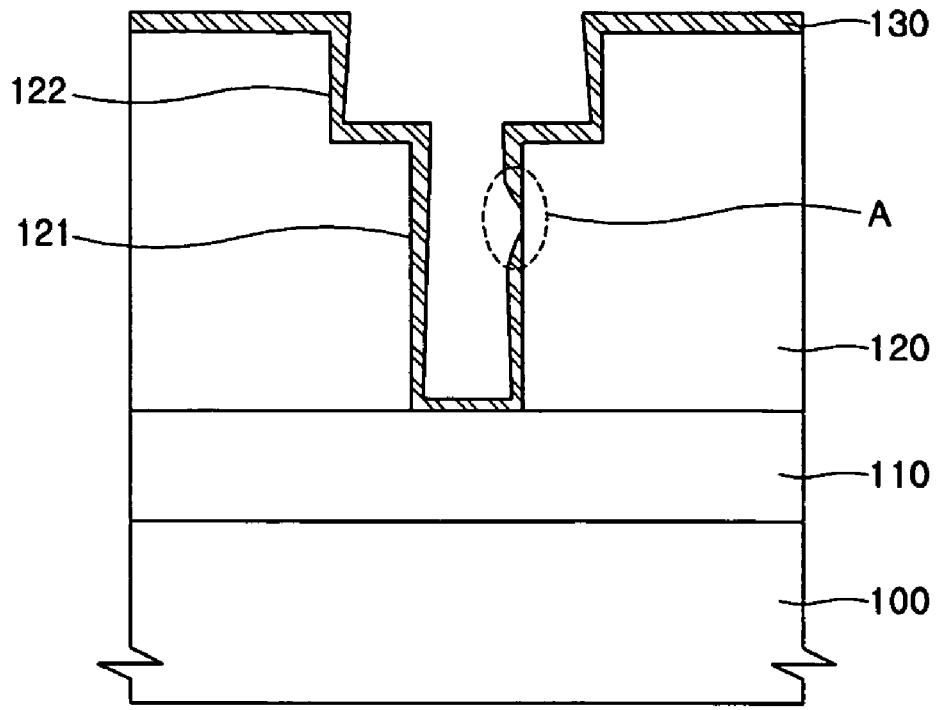
FIG. 2 (RELATED ART)
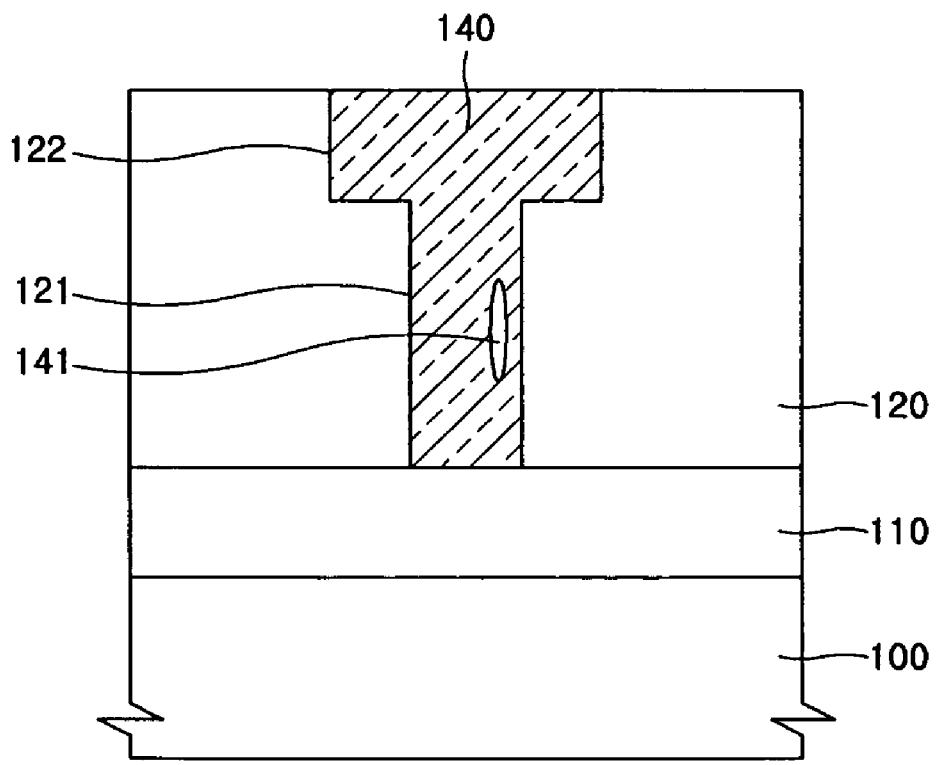

METHOD FOR FABRICATING SEMICONDUCTOR DEVICE

BACKGROUND OF THE INVENTION

1. Field of the Invention

The present invention relates to a semiconductor device, and more particularly, to a method for fabricating a semiconductor device capable of preventing a device failure.

2. Description of the Related Art

In order to satisfy demands for high integration and high performance of semiconductor devices, a metal interconnection with a multilayer structure has been widely used, and aluminum has been used for a metal interconnection. Recently, Copper (Cu) with superior conductivity has been widely used for the metal interconnection.

Since a copper interconnection layer is not easily patterned, the copper interconnection layer is mainly formed by a damascene process and a chemical mechanical polishing (CMP) process.

FIGS. 1 to 4 are diagrams illustrating the occurrence of various failures in the semiconductor devices of the related art.

As illustrated in FIG. 1, an insulating layer 110 is formed on a semiconductor substrate 100, and an inter-metal insulating layer 120 is formed on the insulating layer 110. The inter-metal insulating layer 120 has a trench 122 communicating with a via hole 121. A seed layer 130 is formed in order to easily fill copper in the via hole 121 and the trench 122. The seed layer 130 is formed through a sputtering process. When the seed layer 130 is formed through the sputtering process as described above, the copper may not be uniformly formed on the via hole 121 as indicated by A. That is, the seed layer 130 with a uniform thickness is not formed on the side of the via hole 121, and may have discontinuous step coverage. As the seed layer 130 has a narrower width, it may be difficult to form the seed layer 130.

As illustrated in FIG. 2, a copper interconnection 140 is formed by filling trench and via having the seed layer 130 therein with copper.

However, as illustrated in FIG. 1, in a state in which the seed layer 130 has discontinuous step coverage, when the copper interconnection 140 is formed, a failure such as a void 141 and/or a seam 142 (FIG. 3) may occur in the copper interconnection 140.

Further, when a subsequent process including thermal processing is performed, a failure such as void 143 may occur between the lower portion of the copper interconnection 140 and the insulating layer 110 due to thermal stress as indicated by arrows in FIG. 4. It is widely known that the void 143 occurs because copper may diffuse due to thermal stress.

SUMMARY OF THE INVENTION

Accordingly, the present invention is directed to a semiconductor device (e.g., an integrated circuit or liquid crystal display device) that substantially obviates one or more of the problems due to limitations and disadvantages of the related art.

An object of the present invention is to provide a method for fabricating a semiconductor device capable of preventing a failure, such as a void and/or seam, or a void due to thermal stress by forming a seed layer with continuous step coverage.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure (s) particularly pointed out in the written description and claims hereof as well as the appended drawings.

In accordance with a first embodiment of the present invention, there is provided a method for fabricating a semiconductor device, the method including forming an insulating layer with a contact hole on a semiconductor substrate; forming a seed layer on the insulating layer in the contact hole by electroless plating; and forming a first metal interconnection in the contact hole on the seed layer.

In accordance with a second embodiment of the present invention, there is provided a method for fabricating a semiconductor device, the method comprising: forming an insulating layer with a contact hole on a semiconductor substrate; forming a seed layer on the insulating layer in the contact hole by electroless plating using a predetermined metal material and an additive; and forming a first metal interconnection in the contact hole on the seed layer.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention.

FIGS. 1 to 4 are diagrams illustrating the occurrence of a failure in the related semiconductor device.

DETAILED DESCRIPTION OF THE INVENTION

Hereinafter, the preferred embodiment of the present invention will be described in detail with reference to the accompanying drawings. It is noted that the embodiment of the present invention may be variously modified, and the scope of the present invention should not be interpreted to be limited by the following embodiment.

Figure 3:
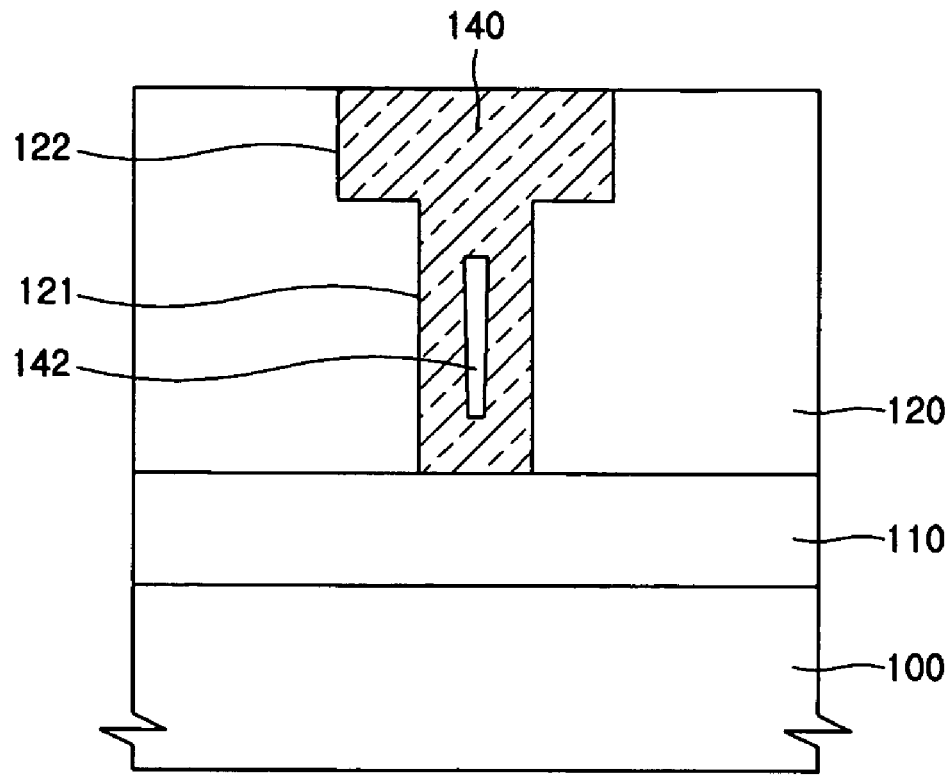
Figure 4:
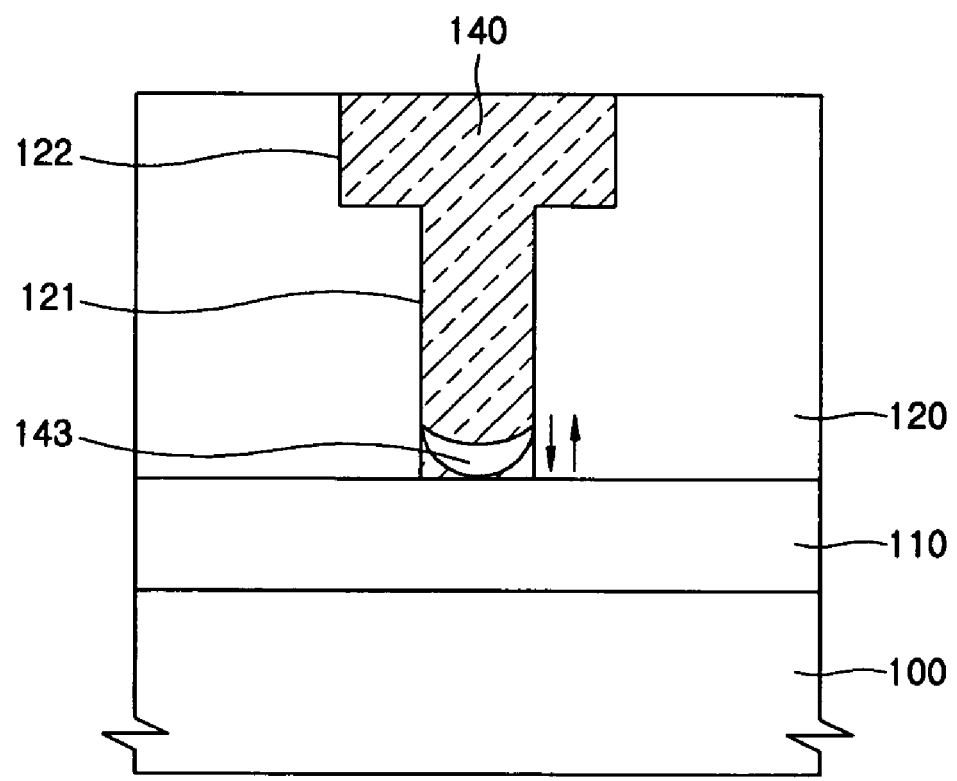
Figure 5:
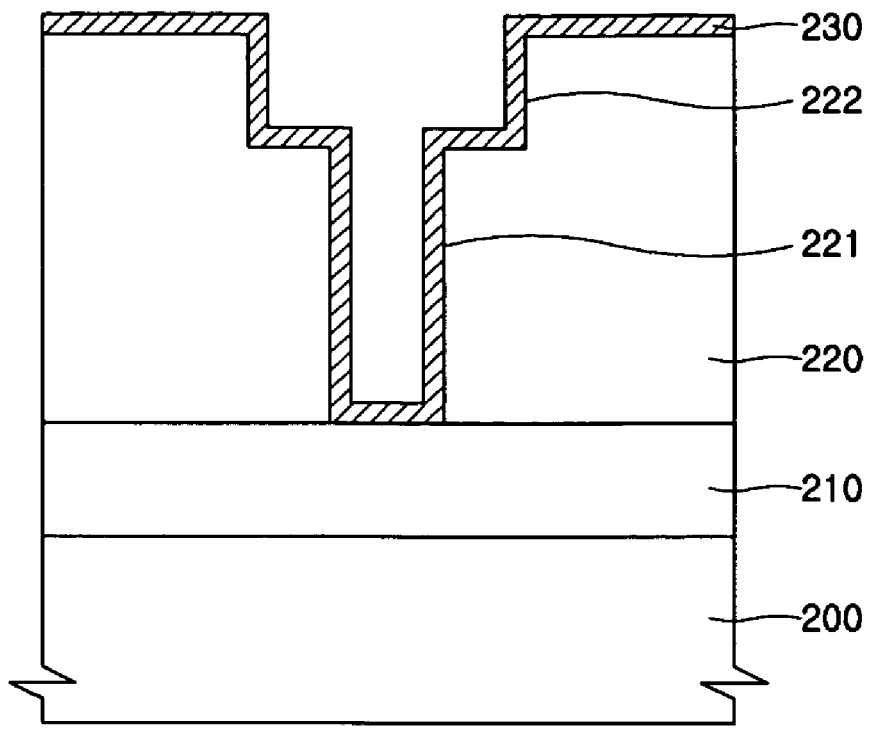
FIGS. 5 and 6 are diagrams illustrating a process for fabricating a semiconductor device according to the present invention.
Figure 6:
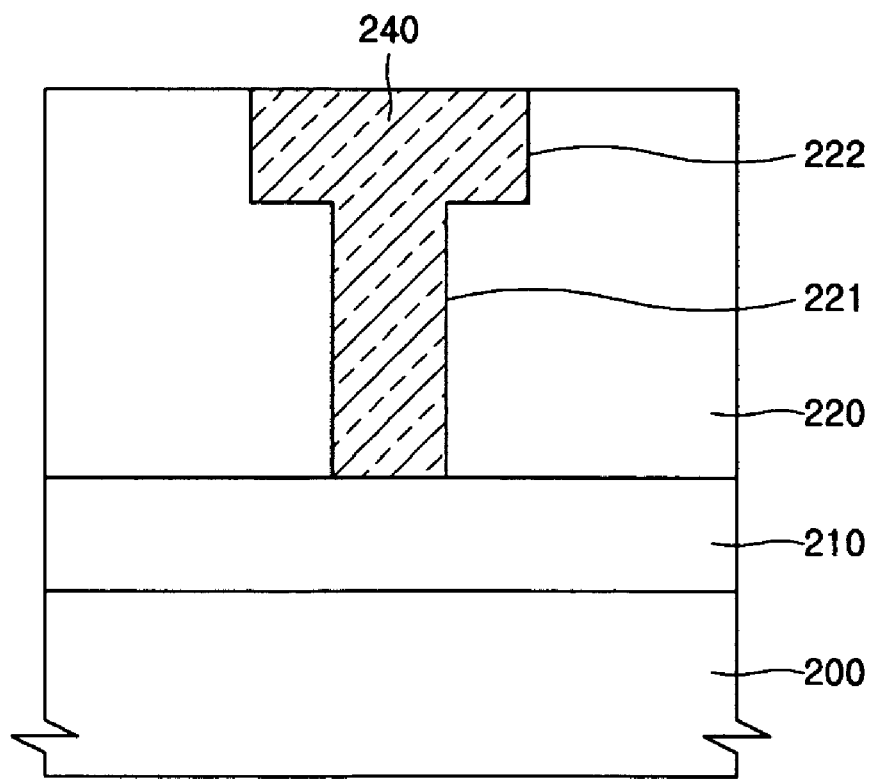

FIGS. 5 and 6 are diagrams illustrating a process for fabricating a semiconductor device according to the present invention.

As illustrated in FIG. 5, an insulating layer 210 is formed on a semiconductor substrate 200. Before the insulating layer 210 is formed, a transistor or a capacitor may be formed on the semiconductor substrate 200. Further, a lower metal interconnection may be formed on or in the insulating layer 210.

An inter-metal insulating layer 220 with a via hole 221 and a trench 222 is formed on the insulating layer 210. First, the inter-metal insulating layer 220 is formed on the insulating layer 210, generally by chemical vapor deposition and/or plasma deposition. Insulating layer 220 may comprise a single material, but more generally, it comprises a multi-layer structure that may include one or more etch stop layers, one or more low dielectric constant layers, and one or more undoped layers (e.g., an etch stop layer such as, e.g., silicon nitride; an optional undoped silicate glass [USG] layer or silicon-rich oxide [SRO] layer thereon; a low dielectric constant layer such as a fluorosilicate glass [FSG] or a silicon oxycarbide [SiOC, which may be hydrogenated (SiOCH)] thereon; an optional second etch stop layer as described above; an optional second low dielectric constant layer as described above thereon or thereover; and an upper ca layer, such as USG, a plasma silane [oxide] layer, a TEOS or $O_3$-TEOS layer, and/or a silicon nitride layer). After deposition, the insulating layer 220 is generally planarized by CMP. The via hole 221 is formed by removing a predetermined region of the inter-metal insulating layer 220, generally by photolithography and selective etching. Then, the trench 222 is formed, which communicates with the via hole 221 and has a width greater than that of the via hole 221. The via hole 221 and the trench 222 may be formed through a damascene or dual damascene process.

A seed layer 230 is formed on the inter-metal insulating layer 220. The seed layer 230 is a medium for easily forming a metal interconnection to be formed later.

The seed layer 230 may be formed through an electroless plating process.

In the electroless plating process, a metal ion in an aqueous metal salt solution is autocatalytically deoxidized or reduced using a deoxidizer or reducing agent without external electrical energy, and metal is extracted or deposited on the surface of a treated material, such as the surface of the insulating layer 220 in the via hole 221 and the trench 222. Preferably, the metal salt comprises a salt of copper, such as $CuCl_2$, $CuI_2$, $CuSO_4$, etc. The deoxidizer or reducing agent may comprise any conventional deoxidizer or reducing agent capable of reducing the copper salt to copper metal, such as formaldehyde, acetaldehyde, glycolic acid, glyoxylic acid, ascorbic acid, a borohydride salt (e.g., $NaBH_4$ or $LiBH_4$), an aminoborane complex, and/or sodium hypophosphate. The copper salt solution can include a complexing agent or chelating agent to form a metal complex and to prevent the precipitation of copper hydroxide, such as tartaric acid, tartrate salts, EDTA, (poly)amines such as ethylenediamine (EDA), amino(poly) acetic acids, meso-erithritol, glycolic acid, and citric acid. Also, the pH of the copper salt solution may be adjusted with a base such as sodium hydroxide, potassium hydroxide, tetramethylammonium hydroxide (TMAH) and/or ammonium hydroxide. This electroless plating process is advantageous in that it may form a metal layer with a relatively uniform thickness, as compared to a sputtered film of the same average or target thickness.

According to the present invention, the seed layer 230 is formed using the electroless plating process instead of the related sputtering process. Accordingly, the seed layer 230 is substantially uniformly formed with continuous step coverage. Specifically, since the side of the via hole 221 and the trench 222 have continuous step coverage, failures such as voids and seams have a reduced incidence or do not occur at all in a subsequently formed metal interconnection.

According to the method for fabricating the semiconductor device as described above, the seed layer is formed through the electroless plating process, so that failures such as voids and seams may be prevented from occurring.

The present invention may also use a variation of the afore-described method.

First, the seed layer 230 is formed through the electroless plating process as described above. However, in the electroless plating process, the seed layer 230 may be formed by adding an additive to the copper salt solution instead of forming the seed layer 230 by using a solution containing only a copper salt as a precursor for a metal seed layer. The additive may include one or more salts of Manganese (Mn), Magnesium (Mg) and Zinc (Zn). For example, magnesium (or a magnesium salt, such as $MgF_2$, $MgCl_2$, $MgI_2$, $MgBr_2$, $MgSO_4$, a magnesium phosphate, etc.) may be added to the copper salt solution as an additive, and then the seed layer 230 may be formed by an electroless plating process. Further, manganese (or a manganese salt, such as $MnF_x$, $MnCl_x$, $MnBr_x$, $MnI_x$ [where x is 2 or 3, preferably 2], a manganese sulfate, a manganese phosphate, etc.) may be added to the copper salt solution as an additive, and then the seed layer 230 may be formed through electroless plating. Also, zinc (or a zinc salt, such as $ZnF_2$, $ZnCl_2$, $ZnBr_2$, $ZnI_2$, $ZnSO_4$, a zinc phosphate, etc.) may be is added to the copper salt solution as an additive, and then the seed layer 230 may be formed by electroless plating. In addition, manganese and magnesium salts may be added to the copper salt solution as an additive, and then the seed layer 230 may be formed through the electroless plating process. As described above, a single additive or a mixed additive can be added to copper as an additive, and then the seed layer 230 may be formed through the electroless plating process.

In more detail, the via hole 221 and the trench 222 are first catalyzed or treated to form a catalyst metal or metal compound (e.g., palladium or PdO) in the via hole 221 and the trench 222. Then, a deoxidizer or reducing agent is used to form a plated layer of Cu—Mn alloy on the catalyst-containing surface without using an external power supply. In the process, the deoxidizer or reducing agent is oxidized and emits electrons. The emitted electrons are combined with metal ions (e.g. $Cu^{2+}$, $Mn^{2+}$ $Mg^{2+}$ and $Zn^{2+}$) so as to form the seed layer 230 (i.e., an alloy of copper and the additive[s]) on the surface of the catalyst.

Such a mechanism may be expressed by reaction equation 1.

$$R + H_2O \rightarrow RO_x + 2H^+ + 2e$$

$$M^{2+} + 2e \rightarrow M^O \quad (1)$$

In reaction equation 1, R denotes a deoxidizer or reducing agent, $O_x$ denotes an oxidized reaction product of the deoxidizer or reducing agent, $M^{2+}$ denotes a metal ion, and $M^O$ denotes a deoxidized metal. Accordingly, $M^{2+}$ may include $Cu^{2+}$ and $Mn^{2+}$, $Mg^{2+}$ and/or $Zn^{2+}$ and $M^O$ may include Cu and Mn, Mg and/or Zn.

As described above, when an additive is added to copper so as to form the seed layer 230, the additive may be diffused on the surface of the seed layer 230 through a thermal process (subsequent process), so that it functions as a diffusion barrier. Accordingly, when a metal interconnection is formed, the diffusion of the copper is prevented, so that a failure such as voids may be reduced or prevented from occurring due to thermal stress. Further, when an additive is added to copper so as to form the seed layer 230 according to the present invention, Electro-Migration (EM) may increase or decrease more than about five times as compared to a case in which the seed layer is formed through the related sputtering process. In the present invention, EM may represent an ability or likelihood that an atom may move due to the flow of electrons.

Through a subsequent process (such as CMP), the seed layer 230 on an upper surface of the inter-metal insulating layer 220 can be removed, but the seed layer 230 formed in the via hole 221 and the trench 222 remains.

As illustrated in FIG. 6, the via hole 221 and the trench 222 are filled with a copper layer deposited on the seed layer 230 through an Electro-Chemical Plating (ECP) process, so that a metal interconnection 240 is formed. That is, the via hole 221 and the trench 222 are filled with the copper layer on the seed layer 230 during the ECP process, so that the metal interconnection 240 may be formed.

Accordingly, since the seed layer 230 has continuous step coverage, it is possible to reduce or prevent failures such as voids and seams from occurring in the metal interconnection 240. In addition, even when a subsequent thermal process is performed, the diffusion of the copper may be prevented due to the additive included in the seed layer 230, so that failures such as voids may be reduced or prevented from occurring due to thermal stress.

In the above description, a dual damascene structure with the via hole and the trench is described. However, the present invention may also be applied to a single damascene structure.

According to the present invention as described above, a seed layer is formed to have continuous step coverage through an electroless plating process, so that failures such as voids and/or seams may be prevented from occurring in a metal interconnection formed on the seed layer. Consequently, it is possible to improve the reliability of a semiconductor product such as an integrated circuit.

Further, according to the present invention, an electroless plating process is used and an additive may be added to the copper so as to form a seed layer, so that the diffusion of the copper may be suppressed by the additive and failures such as voids or seams may be reduced or prevented from occurring due to thermal stress. Consequently, it is possible to improve the reliability of a semiconductor product such as an integrated circuit.

Furthermore, according to the present invention, an electroless plating process is used and an additive may be added to copper so as to form a seed layer, so that it is possible to obtain (or reduce) an electro-migration (EM) by more than about five times that of an otherwise identical seed layer formed by sputtering.

It will be apparent to those skilled in the art that various modifications and variations may be made in the present invention. Thus, it is intended that the present invention covers the modifications and variations of this invention provided they come within the scope of the appended claims and their equivalents.

What is claimed is:

1. A method for fabricating a semiconductor device, the method comprising:
   (a) forming an insulating layer with a contact hole on a semiconductor substrate;
   (b) reducing a metal material in an aqueous metal salt solution using a reducing agent;
   (c) depositing the reduced metal material on a surface of the insulating layer in the contact hole to form a seed layer by electroless plating; and
   (d) forming a first metal interconnection in the contact hole on the seed layer.

2. The method according to claim 1, wherein the contact hole includes a via hole.

3. The method according to claim 1, wherein the contact hole includes a via hole and a trench.

4. The method according to claim 1, wherein the seed layer comprises copper.

5. The method according to claim 4, wherein the seed layer further comprises at least one of manganese, zinc, and magnesium.

6. The method according to claim 4, wherein the first metal interconnection comprises copper.

7. The method according to claim 6, further comprising forming a second metal interconnection by repeating steps (a) to (d).

8. A method for fabricating a semiconductor device, the method comprising:
   (a) forming an insulating layer with a contact hole on a semiconductor substrate;
   (b) adding an additive to an aqueous metal salt solution;
   (c) reducing the additive and a metal material in the aqueous metal salt solution using a reducing agent;
   (d) depositing the additive and the reduced metal material on a surface of the insulating layer in the contact hole to form a seed layer including the metal material and the additive by electroless plating;
   (e) diffusing the additive by a thermal process to form a diffusion barrier; and
   (f) forming a first metal interconnection in the contact hole on the seed layer.

9. The method according to claim 8, wherein the contact hole includes a via hole.

10. The method according to claim 8, wherein the contact hole includes a via hole and a trench.

11. The method according to claim 8, wherein the metal material comprises copper.

12. The method according to claim 8, wherein the additive comprises a member of the group consisting of manganese, zinc, and magnesium.

13. The method according to claim 8, wherein the additive comprises a mixture of manganese, zinc, and magnesium.

14. The method according to claim 8, wherein the first metal interconnection comprises copper.

15. The method according to claim 8, further comprising forming a second metal interconnection by repeating steps (a) to (f).

* * * * *